United States Patent [19]

Evans et al.

[11] Patent Number: 4,825,200

[45] Date of Patent: Apr. 25, 1989

[54] RECONFIGURABLE REMOTE CONTROL TRANSMITTER

[75] Inventors: Benjamin F. Evans, Weatherford; Peter H. Haagen, Arlington; Paul J. Pempsell, Bedford, all of Tex.

[73] Assignee: Tandy Corporation, Fort Worth, Tex.

[21] Appl. No.: 66,853

[22] Filed: Jun. 25, 1987

[51] Int. Cl.[4] .......................... H04B 9/00; H04N 5/44

[52] U.S. Cl. ................................ 341/23; 340/825.56; 340/825.72; 358/194.1; 455/151; 455/353; 455/603; 341/176

[58] Field of Search ............. 340/696, 825.69, 825.72, 340/825.56; 455/603, 352, 353, 151; 358/194.1

[56] References Cited

U.S. PATENT DOCUMENTS 4,623,887 11/1986 Welles, II ........................ 340/825.69
4,626,848 12/1986 Ehlers .............................. 358/194.1
4,712,105 12/1987 Köhler ........................... 340/825.69

*Primary Examiner*—Glen R. Swann, III
*Attorney, Agent, or Firm*—Wolf, Greenfield & Sacks

[57] ABSTRACT

A reconfigurable remote control transmitter can be used with a plurality of remotely controlled products, each of which is normally controlled with one or more signals from an associated remote control transmitter. The reconfigurable transmitter has a plurality of input keys and operates either in a Learn mode in which it may store indications of signals generated by the remote control transmitter from one or more of the products or a Run mode in which it selectively transmits stored signals in response to one or more keyed inputs. During the Learn mode a selected sequence of operations to be performed by one or more of the products in response to a first selected key sequence may be stored and during the Run mode stored signals are transmitted in a predetermined order in response to the performance of the selected key sequence to cause the selected sequence of operations to be performed.

The transmitter may also include one or more timers settable to a selected data and time, which may be utilized to control the transmitting of stored signals or signal sequences.

Finally, a means may be provided which is operative during the Learn mode for indicating that the signal being received by the transmitter from a remote transmitter is of proper strength to permit an indication thereof to be correctly stored.

27 Claims, 6 Drawing Sheets

RECONFIGURABLE REMOTE CONTROL TRANSMITTER

BACKGROUND OF THE INVENTION

1. Field of the Invention

This invention relates to remote control transmitters and more particularly to reconfigurable remote control transmitters which may be programmed to emulate the remote control transmitters for one or more remotely controllable products.

2. Background Discussion

Many consumer products are designed to be operated by an infrared remote control transmitter. Such products include, but are by no means limited to, television receivers, video cassette recorders (VCRs), video disc players, cable converters or boxes, stereo receivers, stereo turntables, other stereo equipment, garage door openers, and a variety of other products used primarily in the home and office. Frequently, two or more of these devices may be used simultaneously such as a television receiver, a cable converter, a video cassette recorder and/or a video disc player. In such cases, it is hard to know which transmitter to pick up to control which product; it is cumbersome to have to deal with three or four remote control transmitters, and it is difficult to keep track of all the transmitters. The necessity of dealing with so many different transmitters significantly reduces the convenience of having a remote control feature.

To overcome this problem, programmable reconfigurable remote control transmitters have been developed which, when in a learning mode, are adapted to receive the infrared coded signals transmitted by two or more remote transmitters and to store compacted representations of these coded signals. Once the transmitter has been programmed, it may be utilized as a universal controller for the products it has been programmed to operate. One such reconfigurable remote control transmitter is described in U.S. Pat. No. 4,626,848 entitled "Programmable Functions for Reconfigurable Remote Control" issued to Raymond G. Ehlers on Dec. 2, 1986.

While transmitters such as that disclosed in the Ehlers patent overcome the problems initially discussed above and permit a single remote control transmitter to be utilized for controlling a number of devices, these devices still have significant limitations. A major limitation is that, when it is necessary to simultaneously operate three or more devices, and particularly when it is necessary to operate such devices in a predetermined sequence, the transmitter is complicated to use and it can take a substantial period of time to accomplish the desired functions. For example, even for the relatively simple, and very commonly utilized, function of turning on a television receiver which is operated from a cable and tuning the system to a desired channel, the following sequence of operations must be performed:

1. The universal controller is set to the cable box.
2. A power key is operated to turn the cable box on.
3. Channel selector buttons are operated to tune the cable box to the desired cable channel.
4. The universal controller is set to the TV receiver.
5. The power key is operated to turn on the TV.
6. Channel select keys are operated to set the TV to the cable input channel (usually channel 3 or channel 4).

Such a sequence of operations may well be beyond the capabilities of a young child, and will in any event tax both the ability and patience of anyone seeking to use the transmitter. If a VCR is also to be turned on, the process becomes even more complicated. It would therefore be desirable if the controller could be programmed to perform certain common functions in response to the depression of a relatively small number of keys, for example two easily identified keys, rather than the six or more keys currently required.

Another desirable function which current programmable remote control transmitters do not perform is to turn on various products and to turn off such products at selected times when the user is not present to do so. For example, if the user wishes to watch a particular program being aired on a cable channel at a time when the user is not home to watch the program, the user would like to be able to cause such program to be taped on his VCR for later viewing. However, existing VCRs do not have the capability of turning on the cable box or of tuning the cable box to a desired channel. While it may be possible to solve this problem by leaving the cable box on and tuned to the desired channel, this would work only if it is desired to tape a single program or only programs from a single cable channel during the user's absence. A need therefore exists for a device which permits a number of different program sequences to be performed on various products at selected times in the absence of the user.

Still another problem with existing controllers is that the signals stored from the remote transmitter for a given product may be stored incorrectly, either because the sending transmitter is too far from or too close to the receiving transmitter, or because the two transmitters are not properly aligned during the learning operation. A need therefore exists to provide the user with a visual, audio, or other indication that the signal being received at the reconfigurable transmitter is of proper strength to permit correct storage.

SUMMARY OF THE INVENTION

In accordance with the above, this invention provides a reconfigurable remote control transmitter for use with a plurality of remotely controlled products, each of which is normally controlled with one or more signals from an associated remote control transmitter. The reconfigurable transmitter has a plurality of input keys and operates either in a Learn mode in which it may store indications of signals generated by the remote control transmitter from one or more of the products or a Run mode in which it selectively transmits stored signals in response to one or more keyed inputs. The invention more particularly involves a first means operative during the Learn mode for storing a selected sequence of operations to be performed by one or more of the products in response to a first selected input key sequence and a second means operative during the Run mode for transmitting stored signals in a predetermined order in response to the performance of a second selected input key sequence to cause the selected sequence of operations to be performed. Typically, the first and second key sequence are the same and involve a preset key followed by a program key.

The transmitter may also include at least one timer means settable to a selected date and time, the second means being operative either in response to the selected input key sequence or in response to a correspondence between the day and time set in the timer means and the current day and time. For preferred embodiments, a plurality of timer means are provided along with means for setting the timer means to days and times at which selected sequences of operations are to be performed by the products and at which said sequences are to be terminated and means responsive to a correspondence between the day and time set in a timer means and the current day and time for transmitting the stored signals required to cause the corresponding sequence of operations to be performed or terminated.

A clock means may also be provided for generating the current day and time and means may be provided for normally displaying the generated day and time. Finally, a means may be provided which is operative during the Learn mode for indicating that the signal being received by the transmitter from a remote transmitter is of proper strength to permit an indication thereof to be correctly stored.

BRIEF DESCRIPTION OF THE DRAWINGS

The foregoing and other objects, features and advantages of the invention will be apparent from the following more particular description of a preferred embodiment as illustrated in the accompanying drawings.

DETAILED DESCRIPTION

Figure 1:
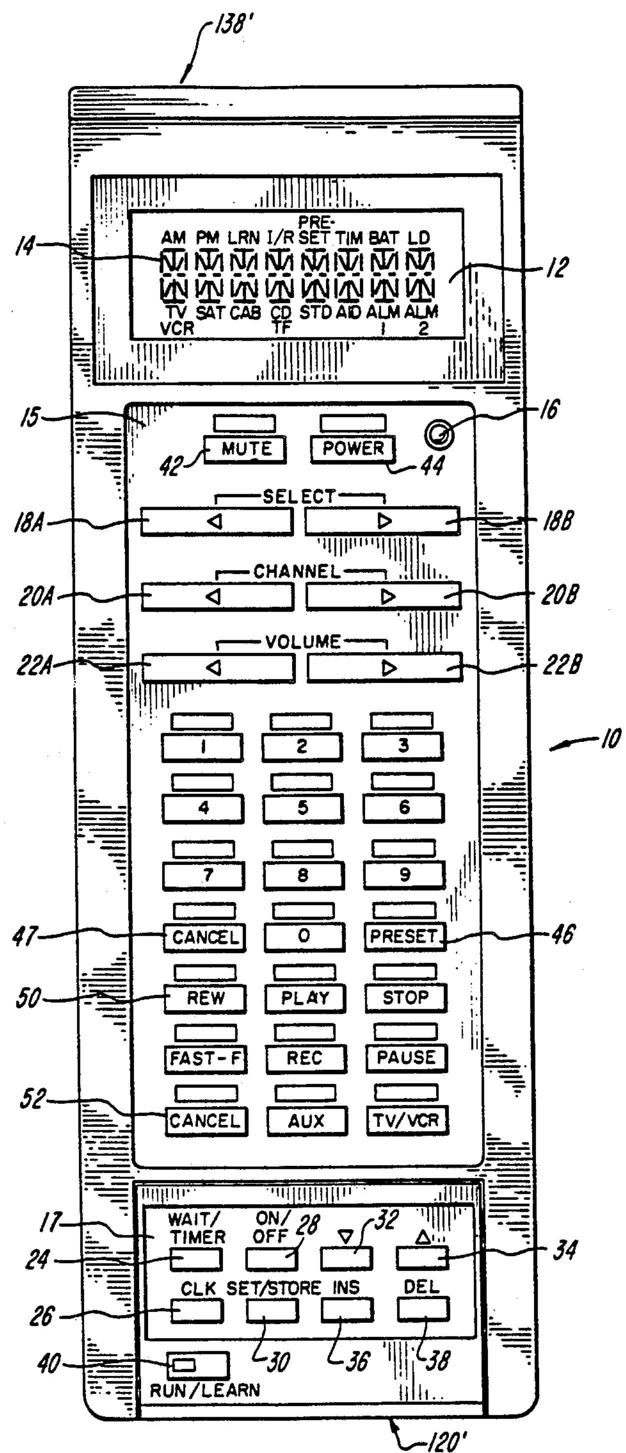
FIG. 1 is a front plan view of a reconfigurable remote control transmitter according to a preferred embodiment of the invention.

Referring to FIG. 1, it is seen that the transmitter unit 10, for a preferred embodiment of the invention, has a display 12, which may for example be an LCD display, and a plurality of input keys. Display 12 is divided into three areas. The primary area 14 displays eight alphanumeric characters in conventional matrix form. Each character may, for example, be formed from a selected plurality of fourteen (14) display segments.

Above alphanumeric characters 14 is printed a plurality of functions and below the alphanumeric diplay is printed a plurality of device indications. A separate, selectively illuminable light source such as an LCD is positioned under each function indication and under each device indication. The manner in which the function indications or annunciators and the device indications or annunciators are selectively illuminated will be described hereinafter. If additional illumination is required for display 12 under low ambient light conditions, a bulb or other suitable light source may be provided which may be switched on as needed.

In addition to display 12, controller 10 also has an area 15 containing keys which are normally used in the Run mode to operate a device, which keys are normally accessible, and an area 17 containing special function keys used for such things as the Learn mode, setting of the clock and timers, and programming keys to perform multiple functions, which area may be normally covered to prevent tampering by children and others. Area 15 has a light 16 which may be a light emitting diode, lamp, or other suitable electrically controlled source of light which is enabled when the system is in its Learn mode and is illuminated when the I/R transmitter of the source controller is suitably positioned with respect to the I/R receiver of controller 10 so as to permit learning of the transmitted codes. Light 16 will not be on during the learning mode if the two controllers are too far apart, or are not sufficiently aligned so as to permit accurate receipt of the transmitted I/R codes.

Controller 10 has a plurality of keys in areas 15 and 17, some of which may be programmed to perform a desired function and some of which are dedicated to a particular function. The dedicated keys include select keys 18A and 18B, which may be used, as will be described later, to select various devices or functions, channel keys 20A and 20B which may be used to step either down or up respectively to select a desired channel, station, or the like for a particular device being controlled and volume controls 22A and 22B which may be used to lower or increase the sound volume of a controlled device. The remaining keys having dedicated functions are in area 17 and include a wait/timer 24, a clock control key 26, an on/off key 28, a set/store key 30, down cursor key 32, up cursor key 34, insert key 36, and delete key 38. Area 17 also includes run/learn switch 40, the setting of which determines whether the controller is operating in its Run mode or Learn mode.

Area 15 also has a plurality of programmable keys, each of which may either perform the function printed on the key or may be programmed to perform another function which a user may indicate in the blank space appearing above the key. Above the select keys 18 are two keys 42 and 44 which may function as a mute key and a power key respectively. However, if desired, these keys may also be programmed to perform other functions in a manner to be described hereinafter. Below volume keys 22, there are ten keys which are nominally indicated as number pads to be used for example for channel selection. There is also a key 46 which is designated as the "preset" key and the function of which will be described hereinafter. The remaining keys are shown labelled with common controller functions such as "sequence", "rewind", "play", "stop", "fast forward", "record", "pause", "cancel" "auxiliary" and "TV/VCR". However, if a function is required for a particular device being controlled which is not reflected on the controller keyboard, any of these keys may be programmed to perform such function for such device and such function may be marked in the blank space above the key.

Figure 2:
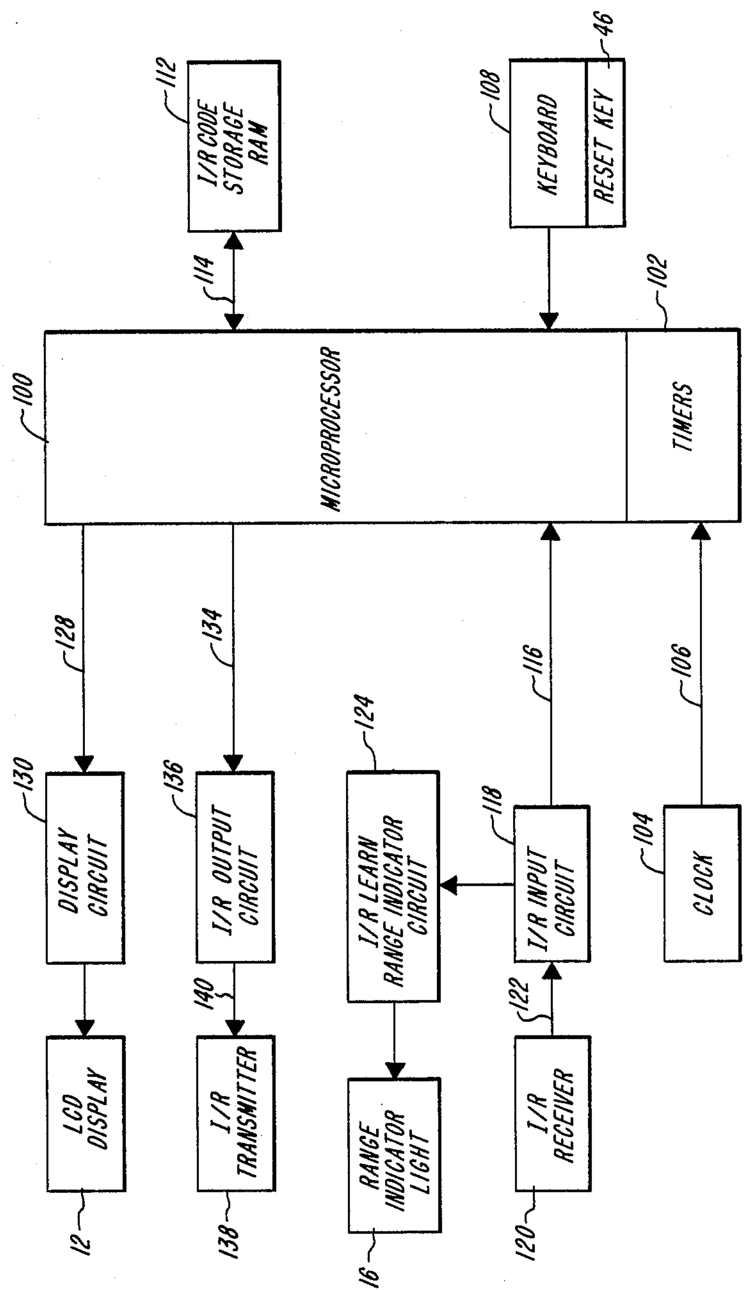
FIG. 2 is a schematic block diagram of a preferred embodiment of a reconfigurable remote control transmitter.

FIG. 2 is a general block diagram of the controller of this invention. The heart of the controller is a microprocesser 100 which microprocesser has a plurality of built-in timers 102. A microprocesser suitable for practicing the teachings of this invention is a model MC68HC05C4 manufactured by Motorola Semiconductor Proudcts, Inc. One input to the microprocesser 100 and the timers thereof is a clock input from clock circuit 104 over line 106. Clock 104 may be a standard timing circuit generating clock pulses at a predetermined frequency, for example, eight pulses per second.

A second input to microprocesser 100 is keyboard 108 over lines 110. Keyboard 108 includes both sections 15 and 17 shown in FIG. 1. Among other keys, keyboard 108 includes the preset key 46. A third input to microprocesser 100 is RAM (Random Access Memory) 112 which is used to store the infrared I/R codes learned by the controller during the Learn mode. These codes are compacted in, for example, the manner discussed in the beforementioned Ehlers patent, or using other code compaction techniques, in order to minimize storage requirements. Compacted codes are transferred between RAM 112 and microprocesser 100 over lines 114. RAM 112 also stores information relating to programmed code sequences to be performed by controller 10.

The final input to microprocesser 100 is over lines 116 from I/R input circuit 118. Circuit 118 receives I/R codes from an I/R receiver 120 over lines 122. Infrared receiver 120 may, for example, be positioned on the bottom of controller 10 as viewed in FIG. 1. Arrow 120′ in FIG. 1 indicates the area of the controller where the I/R receiver would be located.

I/R input circuit 118 also serves as an input to I/R learn range indicator circuit 124 which in turn operates the range indicator light 16. Circuit 124 basically accepts the I/R input signal and, if this signal exceeds a predetermined threshold, is operative to energize the range indicator light.

In addition to providing outputs to RAM 112, microprocesser 100 also energizes the LCD display 12 through lines 128 display control 130 and lines 132. The final output from microprocesser 100 is an output over lines 134 to I/R output circuit 136. Circuit 136 controls I/R transmitter 138 over lines 140. Since controller 10 is intended to operate two or more devices at substantially the same time, which devices may be spaced at some distance from each other, transmitter 138 is more powerful than in standard I/R controllers and in particular consists of a pair of I/R emitting diodes to assure adequate output power. I/R transmitters 138 are located at the top of controller 10 as viewed in FIG. 1 in the area generally indicated by arrow 138′.

Operation

When the controller is first powered by, for example, inserting batteries therein, there are no I/R commands stored in RAM 112 and the clock in microprocessor 100 has not been set. The clock consists of 3 two-character fields of the alphanumeric display 14. The first two of these characters indicate the hour, the second two of these characters indicate the minute, and the third two of these characters indicate the day of the week. Either the AM or the PM function annunciator is illuminated above the alphanumeric characters. Initially, the clock is in its default condition with a setting of "01:00 MO AM". The user must set the clock to the proper time and day in order for the clock and timers to function properly.

The clock is set by exposing area 17 of the controller and initially pressing clock key 26. This causes the clock to show HH:MM DD (where HH is the hours field, MM is the minutes field, and DD is the day of week field) with the AM annunciator continuing to be lit. The HH field will be flashing, indicating that this is the field which is to be set first. Cursor keys 32 and 34 may be operated to increase or decrease the hour until the current hour appears in the display. If the current hour is a PM hour, the cursor is scrolled through the AM hours after which the annunciator toggles to illuminate the PM annunciator as the cursor scrolls through the hours a second time. When the desired hour is located, the select key 18B is then operated to cause the minute field to flash. The minute field is then set to the proper time by use of cursor keys 32 and/or 34, and select key 18B is again operated to advance to the day of week field of the display. The cursor keys are then used to select the appropriate day of the week. This information is stored by operating the store key 30 to complete the clock setting operation. If an error is made at any time during the clock setting operation, cancel key 47 may be operated to delete the stored values causing the clock to return to its previous setting, and the clock setting operation may be begun anew. Once the clock has been set, the current time and day normally appear on display 12 as a default condition. This display utilizes very little power.

Learn I/R Codes

The next step in the operation is to store I/R codes in the I/R code storage RAM 112. The first step in this operation is to operate select keys 18A and 18B to cause the annunciator for the device to be learned to be illuminated. Thus, if the codes from the I/R controller for a TV are to be learned, keys 18A and/or 18B would be operated to cause the leftmost annunciator of the device annunciators, the TV annunciator, to be illuminated.

The next step in the operation is to set run/learn switch 40 to the learn position. If desired, this step can be performed before the device is selected. With the run/learn switch in the learn position, the learn annunciator and the I/R annunciators of the function annunciators are illuminated. Display 14 shows the message SEL KEY.

The next step in the operation is to point the I/R transmitter of the source controller, in this case the controller for the TV, at the I/R receiver 120 of controller 10 and to depress the function key on the source controller for the function to be learned. Thus, if the first function on the TV controller to be learned is the on/off function, the user would press the on/off button of the TV controller while holding this controller with its I/R transmitter facing the I/R receiver of controller 10. The units would be moved relative to each other until range indicator light 16 is brightly illuminated. As long as light 16 is brightly illuminated, the two controllers are within proper range of each other and are aligned for learning.

At this point, the user would release the button on the source controller. The user then presses the key in area 15 of controller 10 which is to control the particular function for the particular device. Assuming, for example, that the on/off button of the TV controller is to be learned, the user might press power button 44 on controller 10 at this time. When the button on controller 10 is depressed, display 14 will show the message BEGIN. Now the user presses the on-off button on the TV controller to input the IR code to controller 10. The key should remain depressed until the in display on the controller 10 shows the message STORED. At this time, the key may be released in the normal manner.

If a new key is not pressed on the source controller within three seconds, the display will again show the message SEL KEY. At this point, a new key on the controller 10 may be pressed, causing the BEGIN message to appear on the display and a key may be pressed on the source controller causing it to output the IR code to be learned. If a key on the controller 10 is pressed before the three-second interval has passed, the BEGIN message will appear on the display and storage of the I/R code may be effected by operating the desired key on the source controller. This sequence of operations may be repeated for each of the keys of the source controller until the codes for all of these keys have been stored. All of the codes from a given source controller may be stored in a single learning session. When all of the codes for a given controller have been stored, the run/learn switch 40 is returned to the run position.

When this is done, the display will change to show the current clock time.

If at any time during the storage operation, controller 10, and in particular microprocessor 100 thereof, detects that an invalid code has been received, an ERROR message will flash on display 14. An attempt may then be made to reenter the last code. When this is done, care should be exercised to assure that the two controllers are properly spaced and aligned so as to cause the I/R learn range indicator light 16 to be fully illuminated. The microprocesser is, however, only capable of detecting invalid codes, and it is possible that an erroneous valid code may in fact be stored. The only way of determining this is by testing the controller to assure that it performs the desired function on the selected device when the key selected on controller 10 is operated.

As previously indicated, since the received I/R codes have a certain amount of redundancy, microprocesser 100 compacts these codes using a technique such as that disclosed in the Ehlers patent, or another suitable compaction algorithm, before storing the information in RAM 112. The particular compaction algorithm utilized does not form part of the present invention. When one of the codes stored in RAM 112 is to be utilized, microprocesser 100 decompacts the stored information to obtain the original I/R code. When all of the codes for a given device have been stored, the process described above may be repeated for the I/R controller of a second device. This process is initiated by using select keys 18A and/or 18B to select the device in the manner previously discussed, moving run/learn switch 40 to its learn position, and then repeating the steps previously discussed to store the I/R codes for the new device. It is noted that the same key may be utilized to perform the same or different functions for two different devices. Thus, if, for example, the second device is a VCR, key 44 may also be designated as the power or on/off key for this device. However, a key such as key 50 may be used for brightness control on the TV while being used to perform the rewind function for the VCR. The user has complete discretion in determining the function to be performed by each key in conjunction with each device but, to the extent keys are performing non-standard functions for a particular device, the user should either indicate such function in the space above the particular key or record this information on an overlay or in some other standard fashion. For ease of use it is preferable that, to the extent a given function is performed for several devices, the same key be used to perform such function.

If at any time while entering codes for a device into controller 10, the user decides that he wishes to use a different key for the particular function than the key he has previously designated for such function, he may operate delete key 38 followed by the key which was previously selected for such function. This will cause the entry in RAM 112 for such function to be deleted. The function may then be reentered in the system in the manner previously discussed and stored in conjunction with the new key.

Programming Sequence

As previously indicated, modern home entertainment systems frequently require two or more devices to be simultaneously operated, and a number of operations to be performed on each such device in order to achieve a desired effect. Examples of such a situation involve the combination of a cable box, television set, and VCR which must be turned on, adjusted to the right channels and, in the case of the VCR, caused to perform a desired function such as record. Another example would be a stereo system including a tuner, one or more amplifiers, a phonograph, a tape player, etc. Again, all of the devices would need to be turned on simultaneously and the tape player may need to be set to a Play mode or a tuner tuned to a desired station. It may also be necessary to select AM or FM for the tuner. Thus, it may be necessary to perform a complex sequence of six or more operations on controller 10 in order to achieve a desired result. In accordance with the teachings of this invention, this tedious and frequently difficult-to-remember sequence may be reduced to a simple two-key operation.

In accordance with the teachings of this invention, any of the program keys in area 15 of controller 10 may function as a program or sequence key to cause a predetermined sequence of steps to be performed in conjunction with one or more devices. A program sequence is learned or stored in the controller by setting run/learn switch 40 to its learn position. As before, this causes both the learn and the I/R annunciators of display 12 to be illuminated.

The next step in the operation is to press preset key 46. When this is done, the preset annunciator is illuminated and the I/R annunciator goes off.

The next step in the operation is to press the key on controller 10 which is to serve as the program or sequence key for the particular program sequence. Once the selected program key has been pressed, display 14 will show Enter. The system may be programmed to abort the program sequence operation if a program key is not selected within some predetermined period of time, for example, 20 seconds, after the preset key has been operated.

Once a program key has been selected, the next step in the operation is to use select keys 18A and/or 18B to select the appropriate device and to operate the key for the device which represents the first step in the desired sequence. For example, if the first step in the sequence is to turn on the cable box, the switches 18 would be operated to select the cable box. The name of the device selected by switches 18 in the sequence will appear on display 14 and the code for the function will be stored in RAM 112 in the first memory location for the selected program sequence.

Once the first key has been successfully entered, down curser key 32 is operated to enable the controller to receive the next key in the sequence. When key 32 is operated, an ENTER message once again appears on the display. The next key, perhaps the power on-off key, in the sequence is then selected and operated in the manner previously described. This sequence is repeated with the down cursor key 32 being operated between each pair of keys in the sequence until all of the keys for the sequence have been entered. If at any time key 32 is not operated after a function has been stored in the sequence, the next function entered will overwrite the function or key previously entered. When the last key of the program sequence has been entered, set/store key 30 is operated to store the sequence. When this occurs, the STORED message will appear on the display for a predetermined period of time, for example, three seconds, and will then be replaced by the normal message when the controller is in its Learn mode which is the SEL KEY message. When this occurs, the preset annunciator display 12 is no longer illuminated and the I/R annunciator is again illuminated.

Before a sequence is stored, the sequence may be reviewed by the user by using cursor keys 32 and 34 to scroll through the sequence. If any mistakes have been made, insert key 36 and delete key 38 may be utilized to correct such error or the erroneous entry may merely be overwritten in the manner previously discussed.

To edit a previously programmed key sequence, the first step is to access the key sequence. If the desired sequence is not already accessed, the preset key 46 is operated followed by the sequence key which is to be edited. Once a sequence is accessed, the display 14 will show the name of the first key or function in the sequence. To move down through the sequence, the cursor down key 32 is operated, and to move up, the cursor up key 34 is operated. If key 32 is operated successively until the end of the sequence is reached, the message ENTER will be displayed. This will permit additional operations to be added at the end of the sequence. If at any time during the operation key 34 is operated, the operation displayed will move back up the sequence until the first operation is displayed. The cursor up operation stops at this point.

Thus, display 14 always shows either the name of a key or the ENTER prompt. This indicates to the user where in the sequence the editing window is located. When the editing window is at a particular position in the sequence, that position may be deleted, the key entered at that position may be changed, or a new key function may be inserted in front of that position in the sequence. To delete a key from the sequence, the sequence is scrolled using keys 32 and 34 until the key name appears on display 14. Delete key 38 is then operated. This will cause the key's name to disappear on display 14 and be replaced by the name of the next key in sequence.

To replace a key in the sequence, keys 32 and/or 34 are operated until the name of the desired key appears on display 14. The desired key to replace such key in the sequence is then operated, overwriting the key previously stored. The old key name disappears from the display and the new key name replaces it.

To insert a new key, keys 32 and 34 are operated to cause the name of the key in front of which a new key is to be inserted in the sequence to appear on display 14. Insert key 36 is then operated, causing display 14 to show the ENTER message. The new key to be inserted in sequence is then operated in the manner previously described, causing the code sequence for this key to be stored and causing the name of this key to appear on display 14.

When editing of a particular key sequence has been completed, the set/store key 30 is operated to store the edited sequence. If a mistake is made at any time during the editing process, the cancel key 52 is operated and the editing operation begins again.

Sometimes a delay must be inserted in the program sequence in order to allow equipment being controlled to become ready for the next command in the sequence. The system has the capability of accommodating such situations by entering a "wait delay" between operations in the program sequence where required.

For the device of this invention, a "wait delay" is inserted when the controller 10 is displaying an ENTER prompt in display 14 by pressing timer/wait key 24. This causes a one-half second delay or wait to be entered into the sequence and causes display 14 to show WAIT. A number of wait entries may be entered in sequence to achieve a desired time delay between functions. For example, if a three-second delay were required between two functions, six wait entries could be made between the two functions.

Setting the Timers

As previously indicated, the system has the capability of running up to six functions or program sequences in response to timer controls when the user is not present to operate the devices. This capability is particularly useful when it is desired to tape a program appearing on a commercial or cable channel with a VCR or to tape a program appearing on an AM or FM station with a tape recorder.

The first step in setting the timers is to position run/-learn switch 40 to the learn position. As before, this causes the learn and I/R annunciators to be illuminated and causes a SEL KEY message to appear on display 14.

The next step in this operation is to press the timer/-wait key 24. This will cause display 14 to show the TIMER message. The next step is to press one of the keys labelled 1 through 5 in area 15 to select timer 1 through timer 5 respectively. When this is done, display 14 will show the current timer setting for the selected timer. If no time has been set in the selected timer, it will display the default timer condition.

To set the timer, set/store key 30 is operated. This will cause the hours field of the timer display to flash. Cursor keys 32 and 34 may be utilized in the same manner as for setting the clock to select the desired hour and AM or PM for the timer. Select key 18B is operated when the desired hour setting has been achieved to cause the minute field to start flashing. Keys 32 and 34 are then utilized to set the timer to the desired minute setting and key 18B is again operated to step the operation to the day field. Cursor keys 32 and 34 are again operated to select the desired day or to set the timer for daily operation.

When the setting of the timer has been completed, set/store key 30 is operated to store the value in the timer. If a sequence key has already been specified for the given timer, this key will be identified. Otherwise, the display will show an ENTER message. At the same time the I/R annunciator will be removed from the display and replaced by the preset annunciator. At this point the user enters the program key which is to be executed when the timer fires. This may be done by pressing preset key 46 followed by the desired program key or by just pressing the desired program key. In either case, the code for the program key selected will be stored with the timer. If there is already a key specified and no change is desired, then all that is necessary is that the select/store key 30 be operated. This key is also operated once a program key has been selected. When key 30 is operated, the learn annunciator reappears and the preset annunciator is removed from display 12.

When a timer is programmed, it is automatically enabled and will cause the selected program sequence to be operated when the clock indicates the time set in the timer. The timers may be disabled and enabled from either the Run mode or the Learn mode by pressing the timer/wait key 24, followed by the timer number (1-5) to select one of the timers. This will cause the current timer setting to be displayed by display elements 14. On/off key 28 is then operated to disable or enable the selected timer. The timer is indicated as "On" by the presence of a "*" between the time and the day.

Deleting Entries from Memory

For an illustrative embodiment of the invention, RAM 112 may be an 8K×8 CMOS RAM which stores the compressed I/R codes, the key sequences and the timer settings. Such a memory might provide a capability of storing up to 119 I/R code settings. However, since a program key sequence takes up a storage space which could otherwise be used to store an I/R code, and there are up to 24 possible key sequences based on the number of available sequence keys, it is possible that the memory might not be able to store more than 95 I/R commands.

Thus, while in most situations controller 10 will have adequate capacity to store all necessary codes for at least eight devices, it is possible that the memory capacity of controller 10 could be exhausted. When this occurs, the unit will display a MEM FULL message when a program sequence input or learning procedure is attempted. When this occurs, it is possible to gain storage space by using the delete function to remove stored I/R codes or stored program key sequences that are no longer of interest to the user. Any time it is desired to delete one or more entries from memory 112, controller 10 is put in its Learn mode by moving switch 40 to the learn position. This causes the SEL KEY message to be displayed. Delete key 38 is then operated. When this is done, the display will show the ENTER message. The item to be deleted is then selected. For an I/R code, this is accomplished by pressing the key associated with that code. It may be necessary, prior to operating such key, to operate select keys 18A and/or 18B to cause the appropriate device to be selected as evidenced by the annunciator for such device in display 12 being illuminated. If a key sequence is to be deleted, this is accomplished, after the operation of the delete key, by pressing preset key 46 followed by the key associated with the sequence which is to be deleted.

Once an item has been deleted, the display will again show a SEL KEY message. Each I/R code or code sequence must be individually deleted from memory 112.

Normal Use

Once controller 10 has been programmed, it may be utilized to control any one of the devices which it has been programmed to control or may, by use of a program key, be utilized to simultaneously control two or more of the devices. To use the controller, Run/Learn switch 40 is set to the run position. If desired, area 17 of the controller may be covered to prevent children or others from tampering with the unit. When the unit is in this condition, it normally displays the time and day of the week.

The first step in using the controller to control a particular device is to operate select keys 18A and/or 18B to illuminate the annunciator corresponding to the selected device. The controller is then held with the I/R transmitter 138 pointed in the general direction of the device to be controlled and the key which has been programmed for the desired function on the desired device is operated. This causes the name of the key or function to appear on display 14 and causes the I/R code for the function to be outputted. When the first function for the device, such as turning it on, has been completed, a key may be depressed to cause a second function to be performed. For example, one or more of the numbered keys may be depressed to select a channel or channel control keys 20A and/or 20B may be operated to perform this function.

If at any time a key is operated for which an I/R code has not been stored in RAM 112 for the selected device, there will be no I/R output from the device and an ERROR message appears on display 14 for a predetermined time duration, for example, three seconds. At the end of this time period, the display returns to the standard time and day display. If the cancel key is pressed during the three-second interval, the ERROR message is cancelled and the standard time and day message appears.

As previously discussed, one or more program sequences may be stored in RAM 112. If a function sequence is desired which has been previously stored, this function sequence may be accessed by pointing transmitter 138 of controller 10 in the general direction of the devices to be controlled and operating preset key 46 followed by the program sequence key for the desired sequence. This will cause the desired program sequence to be performed in the order in which the functions were originally stored. During the period that the program sequence is being performed, the preset annunciator on display 12 will be illuminated.

As previously indicated, once timers 102 have been set, the controller will cause the program sequence associated with a given timer to be performed at the times indicated in the timer unless the timer is in its Wait mode. If the timer is in its Wait mode, the timer may be enabled by operating timer/wait key 24 followed by the number key in area 15 corresponding to the desired timer. The controller may then be left in a location with the transmitter 138 facing generally in the direction of the devices to be controlled and the devices will be controlled by controller 10 to perform the desired program sequence at the times indicated by the selected timers.

While controller 10 is designed to utilize very little power from the batteries energizing it, the batteries will at some point in time wear out. When this occurs, the unit will detect the low power condition and cause the BAT LO annunciator in the upper right hand corner of display 12 to be illuminated. As will be discussed in greater detail hereinafter, RAM 112 is provided with power from a capacitor backup for a selected period, for example five to thirty minutes after batteries have been removed, to maintain the learned I/R codes and program sequences stored therein during battery replacement. If the batteries go completely dead before being replaced, or if the batteries are removed and are not replaced within the interval when the capacitor will maintain RAM 112, the stored codes will be lost and it will be necessary to reprogram the controller in the manner previously discussed before it can be used again.

Detailed Circuit Description

Figure 3A:
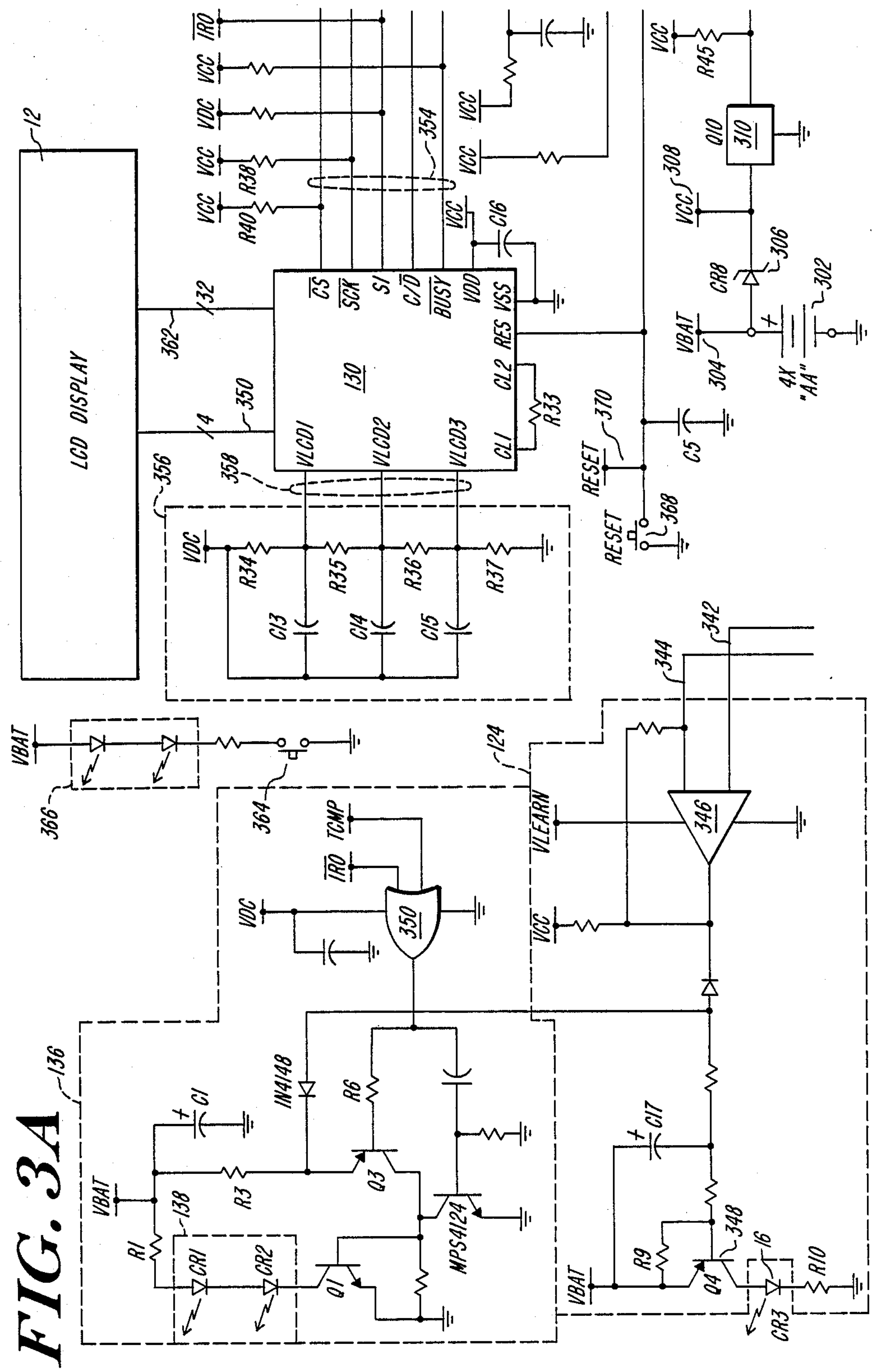
FIGS. 3A–3D, when aligned as shown in FIG. 3, constitute a schematic semi-block diagram of the reconfigurable remote control transmitter according to a preferred embodiment of the invention.
Figure 3B:
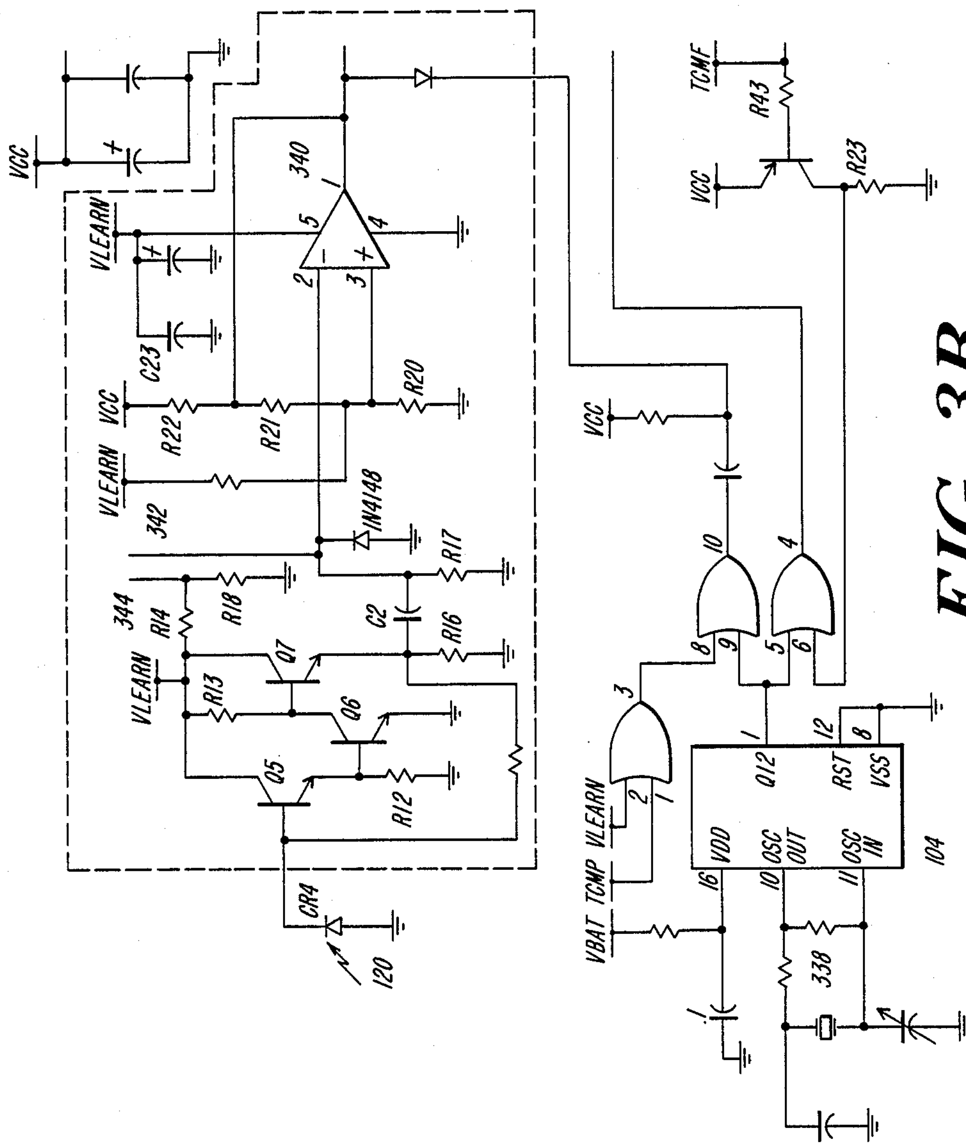
Figure 3C:
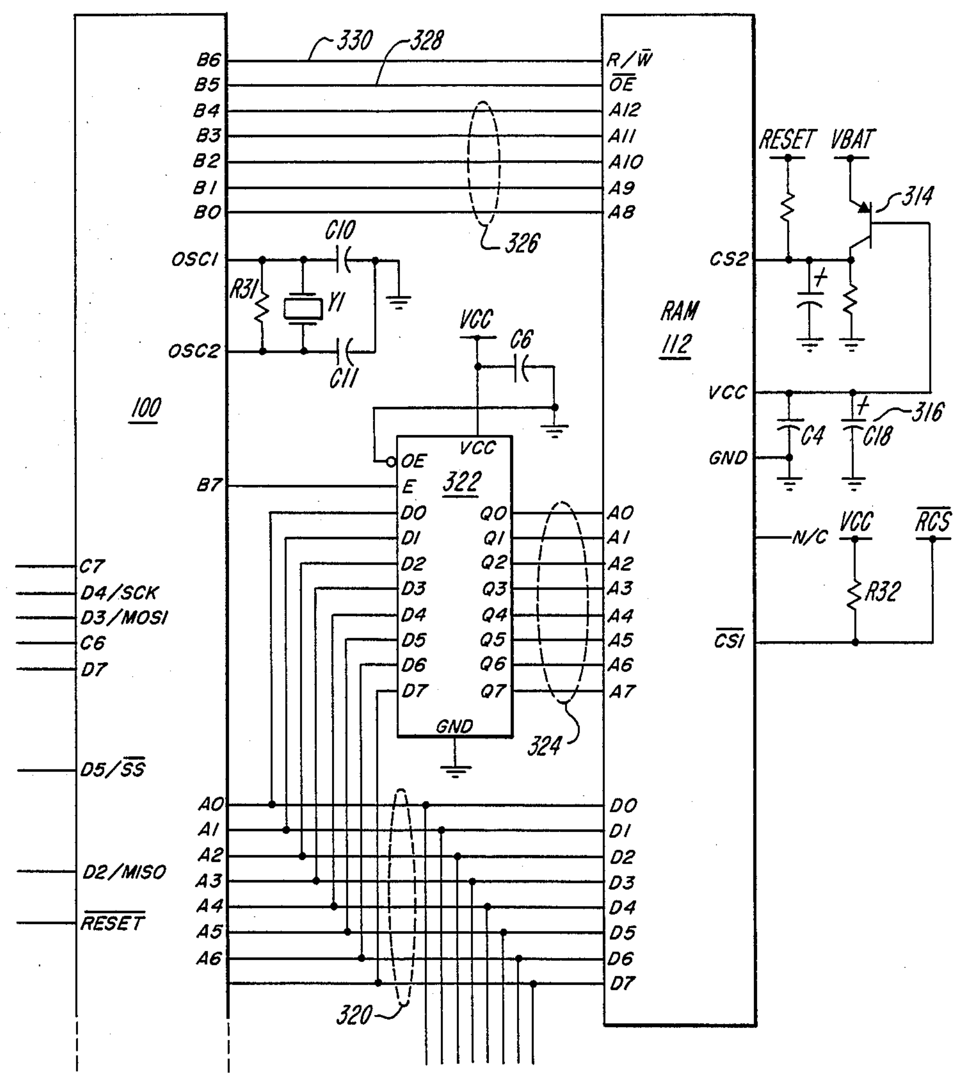
Figures 3, 3D:
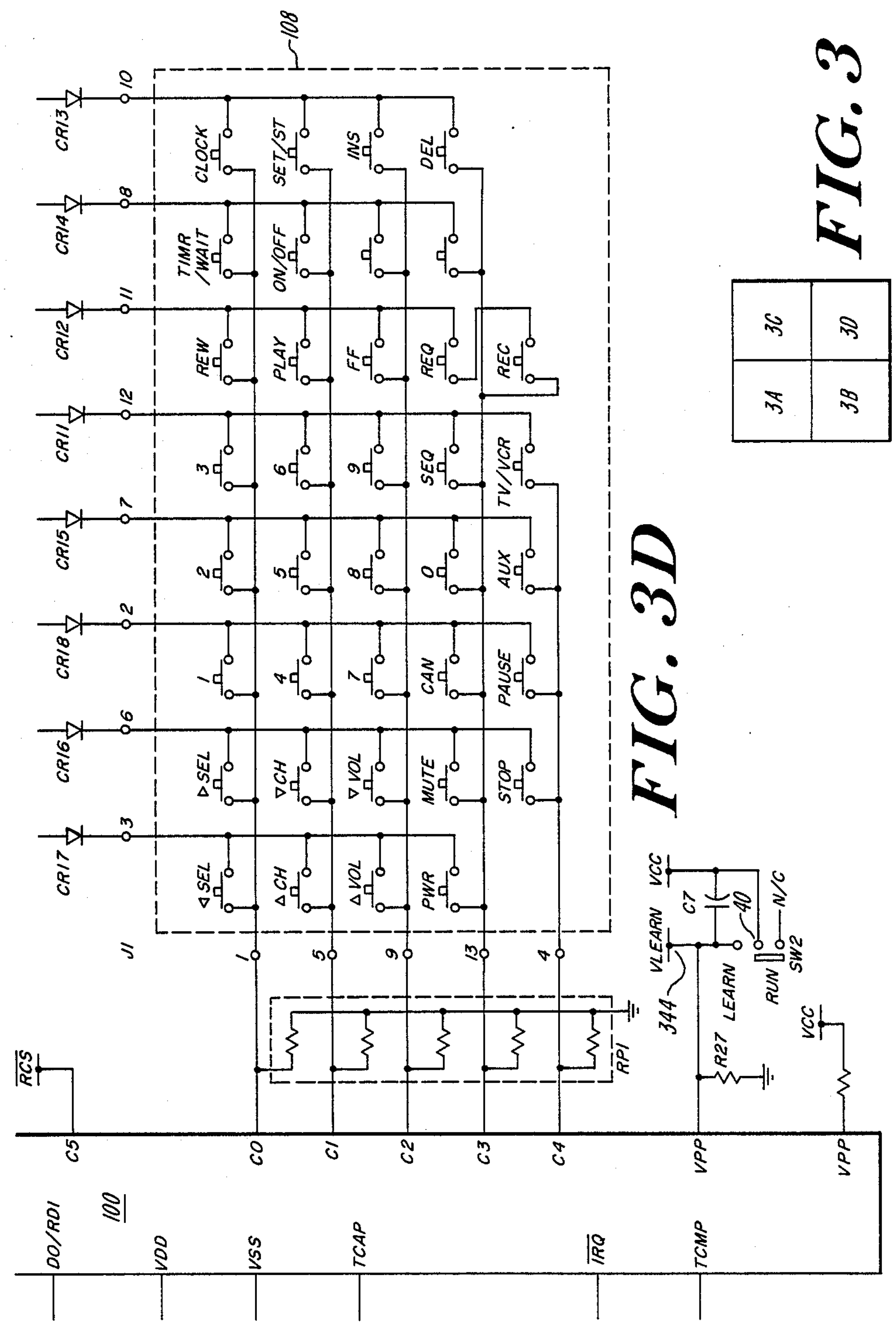

FIG. 3 shows how FIGS. 3A–3D are combined to form a detailed schematic diagram of the circuitry of the controller of a preferred embodiment of the invention. Each of the major elements of the circuit shown in FIG. 2 is also present in the detailed circuit of FIGS. 3A–ED. Timers 102, while not specifically shown in FIGS. 3A–3D, are included within the microprocesser 100. Since most of the components shown in these figures are performing standard functions, the circuit of FIGS. 3A–3D will not be described in detail. However, specific elements of interest in this circuit will be described.

Referring to FIG. 3A, power is provided to the controller by batteries 302 which may, for example, be four standard AA cells. The "VBAT" output 304 from the batteries is applied to many points in the circuit. The output from the battery is also applied through a Shockley diode 306 which serves as a voltage regulator to produce the VCC signal 308 which is also applied to many points in the circuit. The VCC signal is applied through low battery detector 310 to the DO/RDI input pin of microprocessor 100 (FIG. 3D).

Referring to FIG. 3C, battery power is applied through transistor 314 to the power input terminal of RAM 112. Transistor 314 develops a separate regulated VCC voltage for the RAM. The voltage applied to the VCC input pin of RAM 112 also applied to charge capacitor 316 which is a relatively large capacitor on the order of 220 microfarads. If, at any time, battery power is lost because batteries 302 go dead or because the batteries are removed for replacement, capacitor 316 continues to apply power to the RAM for at least an hour so that stored I/R codes and program sequence are not lost. If controller 10 is without power for a period in excess of the period which capacitor 316 is capable of maintaining an adequate voltage level at the VCC input terminal, the stored information in RAM 112 will be lost and it will be necessary to restore information in this device.

The output from the emitter of transistor 314 is connected to the CS2 input pin of the RAM. When battery power is removed, this pin goes essentially to ground, inhibiting operation of the RAM so that spurious outputs which may occur from the microprocessor as power is removed do not cause erroneous information to be stored in the RAM.

RAM 112 is addressed from microprocessor 100 with the lower address inputs being obtained from bus 320 through address latch 322 and bus 324. The upper address inputs to the RAM are obtained directly from the microprocessor through lines 326. Line 328 from the microprocessor is an output enable input to the RAM and line 330 from the microprocessor is the read/write control to the RAM. Data is applied to the RAM over bus 320 to the D0–D7 pins of the RAM and data outputs from the RAM are obtained from these pins through bus 320. Bus 320 also scans keyboard 108 (FIG. 3D) and any key on the keyboard which is detected as being operated results in a suitably coded input being applied to the C0–C4 pins of the microprocessor.

Run/learn switch 40 is shown in FIG. 3D. When this switch is in its learn position, VCC is coupled to the VLEARN output 334 which is applied to many points in the circuit and is also coupled to input pin DI/TDO of the microprocessor. When the VLEARN signal is not being applied to this pin, the processor and the controller are in the Run mode.

Clock chip 104 is controlled by 32 kilohertz crystal 338 (FIG. 3B). The output from clock circuit 104, which is a square wave clock pulse generated at the rate of eight times per second, is applied to microprocessor 100 to control the timers and the clock circuit of the microprocessor.

The I/R input signal at I/R receiver 120 is applied through standard transistor amplification circuitry and through op-amp 340 which squares the signal to the TCAP input pin of the microprocessor.

Output lines 342 and 344 from I/R input circuit 118 are applied to I/R learn range indicator circuit 124 (FIG. 3A). In particular, lines 342 and 344 are applied as inputs to op-amp 346. Op-amp 346 sets a threshold input level for the received I/R signal. If the threshold level is exceeded, op-amp 346 generates an output to switch on transistor 348 causing light 16 to be illuminated. As previously indicated, when light 16 is illuminated, this means that the source controller and controller 10 are properly aligned and spaced so as to permit I/R codes to be properly learned.

The TCAP output and the $\overline{\text{IRQ}}$ output from of the microprocessor are connected as two inputs to gating circuit 350 in I/R output circuit 136. The output from this circuit is applied through transistor amplifiers to energize I/R transmitters 138. Coded outputs appear at the TCAP pins and the $\overline{\text{IRQ}}$ of the microprocessor in response to coded inputs from RAM 112 which are in turn obtained in response to inputs to the microprocessor from keyboard 108.

Display controller 130 receives information inputs from microprocessor 100 over bus 354 and receives reference voltages from circuit 356 over lines 358. Outputs from control circuit 130 are back plane drive lines 360 and segment drive lines 362 to LCD display 12. The combination of the signals on lines 360 and 362 cause the desired LCDs on display 12 to be illuminated.

Additional illumination for the display may be obtained by closing lamp switch 364, permitting battery voltage to flow through light emitting diodes 366, to illuminate the display in low ambient light conditions. A reset button 368 is also provided which would normally be located in the battery compartment. When this button is closed, ground potential appears at reset terminal 370 which is applied to the microprocessor, to display control 130, and to other points in the circuit. This button is energized when there is to be an initial startup of the controller, as when batteries are first placed in the controller, or otherwise as required.

Most of the functions of this invention are performed through the programming of microprocessor 100. Attached as Exhibit A is a pseudo-code description of the operation of the controller which is suitable for enabling one ordinarily skilled in the art to program a microprocessor to perform the desired functions.

While specific circuitry and programming has been described above for performing the various functions of this invention, such circuitry and programming is for illustration purposes only and the invention may be practiced using other suitable circuitry and/or programming. For example, while a light 16 has been shown as the range indicator, such function could be performed by an audio device or other suitable means. It might also be possible to perform some program sequences using a single key or more than two keys may be required where a large number of sequences is desired. Thus, while the invention has been particularly shown and described above with reference to a preferred embodiment, the foregoing and other changes in form and detail may be made therein without departing from the spirit and scope of the invention.

What is claimed is:

1. In a reconfigurable remote control transmitter for use with a plurality of remotely controlled products, each of which is normally controlled with one or more signals from an associated remote control transmitter, said reconfigurable transmitter having a plurality of input keys, having a learn mode in which it may store indications of signals generated by the remote control transmitter for one or more of said products and having a run mode in which it selectively transmits stored signals in response to one or more keyed inputs; the improvement comprising:

first means operative during said learn mode for storing a selected sequence of operations to be performed by one or more of said products in response to a first selected input key sequence; and second means operative during said run mode for transmitting stored signals in a predetermined order in response to the performance of a second selected input key sequence to cause the selected sequence of operations to be performed.

2. A transmitter as claimed in claim 1 wherein said first means is operative in response to the operation of a preset key followed by a key to become a program key.

3. A transmitter as claimed in claim 2 wherein said second means is operative to transmit the stored signals for performing a selected sequence of operations in response to the operation of said preset key followed by the operation of the program key for the selected operation sequence.

4. A transmitter as claimed in claim 1 wherein said first means includes means for selecting the input key sequence for a sequence of operations to be performed; and means for sequentially storing an indication of each operation to be performed, said storing being performed for the operations in the sequence in which the operations are to be performed.

5. A transmitter as claimed in claim 4 wherein said first means includes means operative after the storing of an indication for an operation for enabling the storing of an indication for the next operation.

6. A transmitter as claimed in claim 4 including means for storing one or more "waits" of predetermined duration in said sequence to cause a predetermined delay between the performance of two of the operations.

7. A transmitter as claimed in claim 1 wherein said first means includes means for storing one or more "waits" of predetermined duration in said sequence to cause a predetermined delay between the performance of two of the operations.

8. A transmitter as claimed in claim 1 wherein said first selected input key sequence and said second selected input key sequence are the same.

9. A transmitter as claimed in claim 1 including at least one timer means settable to a selected day and time; and wherein said second means is operative either in response to the selected input key sequence or in response to a correspondence between the day and time set in said timer means and the current day and time.

10. A transmitter as claimed in claim 9 wherein there are a plurality of said timer means; and including means for setting said timer means to days and times at which selected sequences of operations are to be performed by said products and at which such sequences are to be terminated; and means responsive to a correspondence between the day and time set in a timer means and the current day and time for transmitting the stored signals required to cause the corresponding sequence of operations to be performed or terminated.

11. A transmitter as claimed in claim 10 including means for enabling and disabling each of said timer means.

12. A transmitter as claimed in claim 9 including clock means for generating the current day and time; and means operative for normally displaying said day and time.

13. A transmitter as claimed in claim 1 including clock means for generating the current day and time; and means operative for normally displaying said day and time.

14. A transmitter as claimed in claim 1 including means operative during the learn mode for indicating if the signal being received by the transmitter from the remote transmitter for a product is of proper strength to permit an indication thereof to be correctly stored.

15. A transmitter as claimed in claim 14 wherein said means for indicating provides a visual indication.

16. A transmitter as claimed in claim 1 wherein said transmitter is battery powered;

wherein said first means includes a RAM in which said indications and sequences are stored which RAM is erased when power is lost; and including means for maintaining power to said RAM for a limit period in the absence of battery power.

17. A transmitter as claimed in claim 16 wherein said means for maintaining includes a capacitor which is charged when said RAM is being powered by the battery and discharges to maintain power to the RAM in the absence of battery power.

18. In a reconfigurable remote control transmitter for use with a plurality of remotely controlled products, each of which is normally controlled with one or more signals from an associated remote control transmitter, said reconfigurable transmitter having a plurality of input keys, having a learn mode in which it may store indications of signals generated by the remote control transmitter for one or more of said products and having a run mode in which it selectively transmits stored signals in response to one or more keyed inputs, the improvement comprising:

means operative during the learn mode for detecting the strength of the signal being received by the transmitter from the remote transmitter for a product; and means for indicating if the detected signal is of proper strength to permit an indication thereof to be correctly stored.

19. A transmitter as claimed in claim 18 wherein said means for indicating provides a visual indication.

20. In a reconfigurable remote control transmitter for use with a plurality of remotely controlled products, each of which is normally controlled with one or more signals from an associated remote control transmitter, said reconfigurable transmitter having a plurality of input keys, having a learn mode in which it may store indications of signals generated by the remote control transmitter for one or more of said products and having a run mode in which it selectively transmits stored signals in response to one or more keyed inputs; an improved method of operation comprising the steps of:

storing during said learn mode a selected sequence of operations to be performed by one or more of said products in response to a first selected input key sequence; and transmitting stored signals in a predetermined order in response to the performance of a second selected input key sequence during said run mode to cause the selected sequence of operations to be performed.

21. A method as claimed in claim 20 including the steps of selecting the input key sequence for a sequence of operations to be performed; and sequentially storing an indication of each operation to be performed, said storing being performed for the operations in the sequence in which the operations are to be performed.

22. A method as claimed in claim 21 including the step, performed after the storing of an indicator for an operation, of enabling the storing of an indication for the next operation.

23. A method as claimed in claim 20 wherein said first selected input key sequence and said second selected input key sequence are the same.

24. A method as claimed in claim 20 including at least one timer means settable to a selected day and time; and wherein said transmitting step is performed either in response to the selected input key sequence or in response to a correspondence between the day and time set in said timer means and the current day and time.

25. A method as claimed in claim 24 wherein there are a plurality of said timer means; and including the steps of setting said timer means to days and times at which selected sequences of operations are to be performed by said products and at which such sequences are to be terminated; and transmitting the stored signals required to cause the corresponding sequence of operations to be performed or terminated in response to a correspondence between the day and time set in a timer means and the current day and time.

26. A method as claimed in claim 25 including the step of enabling and disabling each of said timer means.

27. A method as claimed in claim 20 including the step, operative during the learn mode, of indicating if the signal being received by the transmitter from the remote transmitter for a product is of proper strength to permit an indication thereof to be correctly stored.

* * * * *